United States Patent [19]

Ishii et al.

[11] Patent Number: 5,368,921
[45] Date of Patent: Nov. 29, 1994

[54] METAL FOIL-CLAD LAMINATE HAVING SURFACE SMOOTHNESS

[75] Inventors: Kenji Ishii; Takamasa Nakai; Hiroyuki Matsumoto, all of Tokyo, Japan

[73] Assignee: Mitsubishi Gas Chemical Company, Inc., Tokyo, Japan

[21] Appl. No.: 736,341

[22] Filed: Jul. 26, 1991

[30] Foreign Application Priority Data

Jul. 27, 1990 [JP] Japan .................. 2-197743

[51] Int. Cl.⁵ .................. B32B 17/02; B32B 5/16; B32B 5/06
[52] U.S. Cl. .................. 428/228; 428/237; 428/240; 428/241; 428/251; 428/285; 428/302; 428/901
[58] Field of Search .............. 428/901, 457, 458, 418, 428/283, 323, 324, 325

[56] References Cited

U.S. PATENT DOCUMENTS

| | | |
|---|---|---|
| 3,801,427 | 4/1974 | Morishita et al. ............ 161/162 |
| 4,671,984 | 6/1987 | Maeda et al. ................ 428/901 |
| 4,751,146 | 6/1988 | Maeda et al. ................ 428/901 |
| 4,772,496 | 8/1988 | Maeda et al. ................ 428/901 |
| 5,080,967 | 1/1992 | Noguchi et al. .............. 428/323 |

FOREIGN PATENT DOCUMENTS

0186831 7/1986 European Pat. Off. ....... H05K 3/38

*Primary Examiner*—James D. Withers
*Attorney, Agent, or Firm*—Sughrue, Mion, Zinn, Macpeak & Seas

[57] ABSTRACT

A metal foil-clad laminate obtained by lamination molding a resin-impregnated substrate and a metal foil, wherein the resin-impregnated substrate contains from 5 to 30% by weight of at least one inorganic filler selected from the group consisting of calcined kaolin, spherical fused silica, non-swellable synthetic mica, and a glass fine powder, the filler having an average particle diameter of from 0.1 to 5 $\mu$m and at least 90 wt % of the filler having a particle diameter of from 0.02 to 5 $\mu$m, and the resin-impregnated substrate is used as at least a surface layer of the laminate or as a resin-impregnated substrate which adheres the metal foil, thereby providing a surface smooth metal foil-clad laminate having a diminished surface undulation attributable to the substrate.

9 Claims, No Drawings

METAL FOIL-CLAD LAMINATE HAVING SURFACE SMOOTHNESS

FIELD OF THE INVENTION

The present invention relates to a metal foil-clad laminate having excellent surface smoothness, which is, substantially free from an "undulation" attributable to a a resin-impregnated substrate, and also having excellent properties and processability which are required for use in electrical applications.

Since the metal foil-clad laminate of the present invention is substantially free from "undulation", an improved close contact between a resist and the laminate is attained during a printed circuit production step, the roughness of the wall surfaces of holes formed in a drilling step is decreased, and as a result, fine line patterned printed circuits with shorter circuit line spaces can be produced.

BACKGROUND OF THE INVENTION

Conventionally, metal foil-clad laminates produced by laminating metal foils such as copper foils to pre-pregs (i.e., resin-impregnated substrates) prepared by impregnating nonwoven or woven glass fabrics with thermosetting resin compositions such as epoxy resins and then drying the fabrics have had "undulations" which are a surface roughness of about 5 $\mu$m. For this reason, such conventional metal foil-clad laminates have been apt to encounter problems, such as poor contacts between resists and the laminates, and etching defects, when finer printed-circuit patterns are to be formed.

As expedients for eliminating the above problems, it has been attempted to, for example, use a thin woven glass fabric as a prepreg to be bonded to a metal foil or use a prepreg having an increased resin content. However, such expedients have failed to substantially completely eliminate the "undulation" attributable to the fabrics.

On the other hand, it is known that an inorganic filler-containing prepreg is used in laminates or metal foil-clad laminates using woven or nonwoven fabric substrates and that such an inorganic filler can be suitably used in a varnish in an amount of about 5–70% by weight in terms of the content of the filler in the solid components of the varnish. It is also known that the use of an inorganic filler improves dimensional stability, strength, electrical characteristics, and other properties as disclosed in, for example, JP-B-63-65092, JP-A-1-235293, and JP-A-1-150543. (The terms "J-B" and "JP-A" as used herein mean an "examined Japanese patent publication" and an "unexamined published Japanese patent application".) However, laminates having surface smoothness cannot be obtained by any techniques disclosed in the above references. In addition, the problems on drilling processability, heat resistance under moisture-absorbed conditions, metal-foil peel strength, and the like remain unimproved and, hence, the laminates obtained by the above techniques cannot be used as recent metal foil-clad laminates, on the surfaces of which electrical or electronic parts are mounted.

Furthermore, improvements of drilling processing conditions, use of a woven glass fabric which has undergone open filament treatment, and other expedients have been attempted to improve drilling processability. However, the attainable roughness of wall surfaces of drill holes, which conventionally is around 30 $\mu$m, has not been improved significantly.

SUMMARY OF THE INVENTION

The present inventors conducted intensive studies to overcome the above-described problems and to develop a metal foil-clad laminate which has surface smoothness, heat resistance under moisture-absorbed conditions, drilling processability, workability, and other properties and can hence be advantageously used in forming finer patterned printed circuits. As a result, it was first found that an improvement in surface smoothness is considerably related to the particle diameter of inorganic filler. Further studies have been made based on the above and, as a result, the present invention has finally been accomplished.

Accordingly, an object of the present invention is to provide a metal foil-clad laminate having excellent surface smoothness and also excellent properties required for electrical use.

The present invention provides a metal foil-clad laminate obtained by lamination molding a resin-impregnated substrate and a metal foil, wherein the resin-impregnated substrate contains from 5 to 30% by weight based on the weight of the resin-impregnated substrate of at least one inorganic filler selected from the group consisting of calcined kaolin, spherical fused silica, non-swellable synthetic mica, and a glass fine powder, the filler having an average particle diameter of from 0.1 to 5 $\mu$m and at least 90 wt % of the filler having a particle diameter of from 0.02 to 5 $\mu$m, and the resin-impregnated substrate is used as at least a surface layer of the laminate or as a resin-impregnated substrate which adheres the metal foil, thereby providing a surface smooth metal foil-clad laminate having a diminished surface undulation attributable to the substrate.

According to preferred embodiments of the above laminate, substantially all of the inorganic filler has a particle diameter of from 0.1 to 5 $\mu$m; the content of the inorganic filler in the resin-impregnated substrate is from 10 to 25% by weight based on the weight of the resin-impregnated substrate; the inorganic filler is a filler which has been surface-treated with a coupling agent; and the metal foil-clad laminate is obtained by using a woven fabric or a nonwoven fabric as the substrate for the resin-impregnated substrate, and lamination molding the resin-impregnated substrate and the metal foil in the manner such that the substrate is either the woven fabric or nonwoven fabric alone, or the nonwoven fabric constitutes an intermediate layer and the woven fabric constitutes the surface layer.

DETAILED DESCRIPTION OF THE INVENTION

The substrate for the resin-impregnated substrate used in the laminate of the present invention is not particularly limited as long as it can be used in various kinds of conventional laminates for electrical use. Generally, the substrate is a nonwoven glass fabric, a woven glass fabric, a mixed nonwoven or woven fabric of glass fibers and other kinds of fibers, a woven fabric made from polyamide fibers, or the like. The thickness of the substrate is not especially limited, but the preferred thickness is from 0.05 to 0.2 $\mu$mm. Substrates which have undergone open filament treatment or treatment for making the fibers brittle (over heat treatment) are more preferred from the standpoint of drilling processability, etc.

The resin used to impregnate the above-described substrate to produce the resin-impregnated substrate is not particularly limited as long as it can be used in various conventional laminates for electrical use. However, epoxy resins are particularly effective. Examples thereof include bisphenol A epoxy resins, phenol novolac epoxy resins, cresol novolac epoxy resins, brominated bisphenol A epoxy resins, brominated phenol novolac epoxy resins, other polyfunctional epoxy resins, and the like; compositions obtained by compounding with these epoxy resins a conventional modifying resin such as a heat-resistant engineering plastic (e.g., polyetherimides and poly(phenylene ether)s), a saturated or unsaturated polyester resin, a cyanate resin (e.g., cyanate ester resins and cyanate ester-maleimide resins), a polyimide resin, or the like; and compositions obtained by blending with the above epoxy resins a conventional hardener such as dicyandiamide, diaminodiphenylmethane, a phenol (e.g., phenol novolac resins), an acid anhydride, or the like, a curing catalyst such as an imidazole (e.g., 2-methylimidazole, 2-ethyl-4-methylimidazole, 2-undecylimidazole, 2heptadecylimidazole, 2-phenylimidazole, and 1-benzyl-2-methylimidazole), an amine (e.g., benzyldimethylamine), or the like, an inorganic or organic filler, a flame retardant, a pigment, a dye, etc.

In general, various kinds of materials including silicas such as natural silica, fused silica, and amorphous silica; white carbon; titanium white; Aerosil; clay, talc; wollastonite; natural mica; synthetic mica; kaolin; aluminum hydroxide; magnesia; alumina; pearlite; fine powders of glasses such as E-glass, A--glass, C-glass, L-glass, D-glass, S-glass, M-glass, and G20-glass, and the like are known as inorganic fillers.

However, for use in laminates for electrical use, inorganic fillers are required to bring about excellent drilling processability, heat resistance under moisture-absorbed conditions, copper-foil peel strength, and other properties. In this respect, the inorganic filler used in the present invention is at least one member selected from the group consisting of calcined kaolin, spherical fused silica, non-swellable synthetic mica, and a glass fine powder. If, for example, a silica other than spherical fused silica is used to produce laminates, the drilling processability of the laminates is so poor that drilling of the laminates results in an increased wear of the drill bits. If a mica other than non-swellable synthetic mica is used, the resulting laminate shows poor heat resistance under moisture-absorbed conditions. Further, conventional glass powders which are fine powders satisfying the particle size requirements defined in the present invention are not commercially sold and are not easily available. Commercially available glass powders have had difficulties in giving surface smoothness, workability, and other properties to the laminates.

The inorganic filler which can be used in the present invention has an average particle diameter of from 0.1 to 5 $\mu$m, and at least 90 wt % of the inorganic filler has a particle diameter of from 0.02 to 5 $\mu$m, preferably from 0.1 to 5 $\mu$m. Such a filler is extremely useful to improve surface smoothness. If the particle diameter exceeds 5 $\mu$m, the filler tends to precipitate from the varnish and, as a result, not only uniform coating of the varnish becomes difficult, but the resulting laminate has poor surface smoothness. On the other hand, if the particle diameter is less than 0.02 $\mu$m, impregnation of the substrate with the varnish is difficult because the viscosity increase of the varnish is remarkable and, as a result, the inorganic filler cannot be blended in an amount sufficient for imparting surface smoothness to laminates.

The amount of the inorganic filler blended with the resin-impregnated substrate is from 5 to 30% by weight, preferably from 10 to 25% by weight. If the amount of the inorganic filler blended is below 5% by weight, surface smoothness is not imparted. If the amount of the inorganic filler exceeds 30% by weight, surface smoothness becomes also poor.

In a preferred method for preparing such a resin-impregnated substrate, an inorganic filler is blended with a varnish in an amount of from 10 to 45% by weight based on the total amount of the resin solid component in the varnish and the inorganic filler to adjust the concentration of the solid content in the varnish in the range of from 30 to 75% by weight. It is particularly preferred from the standpoint of water resistance to use the inorganic filler which has been surface-treated with a silane coupling agent or the like.

The metal foil-clad laminate of the present invention is produced by using the inorganic filler-containing resin-impregnated substrate obtained as described above at least as the prepreg adhering to a foil of a metal such as copper or aluminum or as the prepreg constituting the surface layer, and lamination molding the same in an appropriate combination with other resin-impregnated substrates or printed-circuit boards for inner layer use. From the standpoint of drilling processability, it is preferred to use the above-described inorganic filler-containing resin-impregnated substrate as each of all the layers in the laminate. Lamination methods are not particularly limited, but a conventional lamination method for producing laminates or multilayer boards for electrical use can be used. For example, the lamination is performed by means of multi-daylight pressing, multi-daylight vacuum pressing, continuous laminating, autoclave laminating, etc., at a temperature of from 100° to 200° C. and a pressure of from 2 to 100 kg/cm$^2$ for a period of from 0.03 to 3 hours.

The present invention will be explained in more detail by reference to the following Examples, which should not be construed as limiting the scope of the invention. In these Examples, all parts and percents are by weight unless otherwise indicated.

EXAMPLE 1

In a mixed solvent of methyl ethyl ketone and N,N-dimethylformamide (70/30) were dissolved 100 parts of a brominated bisphenol A epoxy resin (trade name "Epikote 104", manufactured by Yuka Shell Epoxy K.K., Japan; Br content 18-20%, epoxy equivalent 450-500), 3.5 parts of dicyandiamide, and 0.2 part of 2-methylimidazole to obtain a varnish having a resin solid content of 65% (hereinafter referred to as "Varnish 1").

The above-obtained Varnish 1 was impregnated into a plain weave glass fabric having a thickness of 0.18 mm and the resulting fabric was dried at 160° C. for 6 minutes, thereby producing a prepreg having a resin content of 45% (hereinafter referred to as "PP1").

On the other hand, each of the inorganic fillers specified below, which were different in material and particle diameter, was blended with the above-obtained Varnish 1 according to the formulations shown in Table 1. The resulting mixtures were stirred sufficiently with a homomixer to prepare nine kinds of varnishes (hereinafter referred to as "Varnishes 11 to 19"). Each of these Varnishes 11 to 19 was impregnated into a plain weave glass fabric having a thickness of 0.18 mm and the resulting fabrics were dried at 160° C. for 6 minutes, thereby producing prepregs in which the total content of resin solid and inorganic filler was 55% (hereinafter referred to as "PP11 to PP19").

Eight sheets of PP1 were superposed on one another and sandwiched between two electrolytic copper foils having a thickness of 18 μm, and the assembly was lamination molded at 170° C. and 30 kg/cm² for 2 hours, thereby producing a double-side copper-clad laminate having a thickness of 1.6 mm. Further, using each of PP11 to PP19, a double-side copper-clad laminate having a thickness of 1.6 mm was obtained in the same manner as above except that the number of prepreg sheets used was changed to seven for each prepreg.

The surface smoothness of each of the copper-clad laminates obtained above was measured. The results obtained are shown in Table 1.

[Inorganic filler]

F11: E-glass powder (treated with a silane coupling agent); average particle diameter: 10 μm, particle diameter distribution: 5-20 μm, manufactured by Nitto Boseki Co., Ltd.

F12: Fused silica (trade name, Fuselex X); average particle diameter: 5 μm, particle diameter distribution: 3-10 μm, manufactured by Tatumori Ltd.

F13: Calcined kaolin (trade name, Satinton SP 33); average particle diameter: 1.3 μm, particle diameter distribution: 1-3 μm, manufactured by Tsuchiya Kaolin Ind., Ltd.

F14: Spherical fused silica (trade name, Fuselex FF5X); average particle diameter: 0.5 μm, particle diameter distribution: 0.1-1 μm, manufactured by Tatumori Ltd.

F15: Spherical fused silica (trade name, Fuselex FF10X); average particle diameter: 1 μm, particle diameter distribution: 0.5-2 μm, manufactured by Tatumori Ltd.

F16: Non-swellable synthetic mica (trade name, PDM-K); average particle diameter: 3 μm, particle diameter distribution 2-4 μm, manufactured by Topy Ind., Ltd.

F17: L-glass powder (treated with a coupling agent); average particle diameter: 4 μm, particle diameter distribution: 3-6 μm, manufactured by Central Glass Ltd.

[Surface roughness ($R_{ZD}$)]

Measurement was made with a surface roughness meter (Surfcom 733 A, manufactured by Tokyo Seimitsu Co., Ltd., Japan).

Lengthwise: The direction of the warp of woven glass fabric.

Crosswise: The direction of the weft of woven glass fabric.

Bias: The direction forming an angle of 45° to both of the warp and the weft of woven glass fabric.

[Undulation attributable to fabric]

In the above measurement with a surface roughness meter, the presence or absence of a surface undulation attributable to the substrate was judged as to whether or not the surface had an undulation corresponding to the weave pattern of the woven glass fabric.

TABLE 1

| Test No. | Prepreg | | | Surface roughness ($R_{ZD}$), μm | | | Undulation |
| | Kind | Filler | Amount (parts) | Lengthwise | Crosswise | Bias | |
| --- | --- | --- | --- | --- | --- | --- | --- |
| Comparative | | | | | | | |
| 1 | PP1 | — | — | 4.13 | 3.02 | 4.77 | Present |
| 2 | PP11 | F11 | 19.25 | 3.68 | 3.02 | 3.72 | " |
| 3 | PP12 | F12 | 19.25 | 3.15 | 2.52 | 2.57 | Slightly present |
| Example | | | | | | | |
| 4 | PP13 | F13 | 19.25 | 2.73 | 2.63 | 2.70 | None |
| 5 | PP14 | F14 | 19.25 | 3.49 | 1.96 | 2.93 | " |
| 6 | PP15 | F15 | 19.25 | 2.04 | 1.87 | 2.12 | " |
| 7 | PP16 | F15 | 10.31 | 2.49 | 2.38 | 2.66 | " |
| 8 | PP17 | F15 | 5.6 | 2.41 | 2.16 | 2.59 | " |
| 9 | PP18 | F16 | 19.25 | 1.77 | 1.81 | 2.12 | " |
| 10 | PP19 | F17 | 19.25 | 2.37 | 1.64 | 2.28 | " |

EXAMPLE 2

Two copper-clad laminates were produced in the same manner as in Example 1 except that one laminate was produced from an assembly prepared by superposing five sheets of PP1 one another, sandwiching the superposed prepreg sheets between two sheets of PP13, and further sandwiching the resulting composite between two electrolytic copper foils (Test No. 1) and the other laminate was produced from an assembly prepared in the same manner as in Test No. 1 above except that the electrolytic copper foils were replaced with rolled copper foils (Test No. 2). The thus-obtained laminates were examined for surface roughness, and the results obtained are shown in Table 2.

TABLE 2

| Test No. | Surface roughness ($R_{ZD}$) μm | | | Undulation |
| | Lengthwise | Crosswise | Bias | |
| --- | --- | --- | --- | --- |
| 1 | 2.59 | 2.56 | 2.94 | None |
| 2 | 1.18 | 1.20 | 1.39 | " |

It can be understood from Examples 1 and 2 above that the copper-clad laminates of the present invention, which use the specific prepreg, are substantially free from the surface undulation attributable to the weave pattern of the glass fabric and the surface roughness of each laminate is attributable to the surface roughness of the copper foil.

EXAMPLE 3

Copper-clad laminates were produced in the same manner as in Example 1 except that varnishes were prepared using the inorganic fillers specified below in place of those used in Example 1.

These copper-clad laminates and some of the copper-clad laminates produced in Example 1 were examined for copper-foil peel strength, PCT resistance, measling resistance, heat resistance, and methylene chloride resistance. The results obtained are shown in Table 3.

[Examination conditions and others]
Peel: Copper-foil peel strength; unit kg/cm.
A: Initial value.
S₄: Value measured after dipping in a solder bath at 260° C. for 30 seconds and cooling to room temperature.
HR: Heat resistance (E-10/200); Copper foil was examined for swelling after treatment at 200° C. for 10 hours.
X: Swelling
○: Good
◉: Excellent
PCT: Pressure cooker test according to IPC-TM-650-2.6.16 (steam treatment at 2.5 atm for 4 hours after removal of the copper foil by etching).
Appearance: Appearance after the treatment.
Wab: Water absorption after the treatment; unit %.
Dip: Test piece after the treatment was dipped in an oil at 260° C. and then examined for appearance.
X: Swelling
△: Poor
○: Good
◉: Excellent.
WBT: Measling resistance.
Copper foil was removed by etching, and the resulting laminate was boiled in hot water for 8 hours (D-8/100), dipped in an oil at 260° C. for 30 seconds, and then examined for appearance and weight increase (Wab, %).
X: Swelling
○: Good
◉: Excellent.
MCR: Methylene chloride resistance.
Copper foil was removed by etching, and the resulting laminate was treated for 1 hour with boiling methylene chloride (having a temperature of about 40° C.) and then examined for appearance and weight increase (MCab, %).
X: Partly dissolved out △: Swelling
○: Good
[Inorganic filler]
F13: Calcined kaolin (trade name, Satinton SP 33); average particle diameter 1.3 μm, particle diameter distribution 1–3 μm, manufactured by Tsuchiya Kaolin Ind., Ltd.
F16: Non-swellable synthetic mica (trade name, PDM-K); average particle diameter 3 μm, particle diameter distribution 2–4 μm, manufactured by Topy Ind., Ltd.
F17: L-glass powder (treated with a coupling agent); average particle diameter 4 μm, particle diameter distribution 3–6 μm (at least 90 wt %, is 5 μm or less), manufactured by Central Glass Ltd.
F18: Fused silica (trade name, Imusil A108); average particle diameter 2.5 μm, particle diameter distribution 1–5 μm.
F19: Aluminum hydroxide (trade name, Higylite H-42), manufactured by Showa Denko Co.
F20: Natural silica (trade name, Crystalite VXX).
F21: Natural mica (trade name, Mica A-11).
F22: Talc (trade name, 5000 PJ).
F23: Wollastonite (trade name, Kemorit S-3).
F24: Magnesia (trade name, Kyowamag 30).
F25: Kaolin (trade name, ASP-100).

TABLE 3

| Test No. | Inorganic filler | Peel A | S₄ | HR Appearance | PCT Appearance | Wab | Dip | WBT Appearance | Wab | MCR Appearance | MCab |
|---|---|---|---|---|---|---|---|---|---|---|---|
| Example | | | | | | | | | | | |
| 1 | F13 | 1.58 | 1.55 | ◉ | ◉ | 0.69 | ◉ | ◉ | 0.32 | ○ | 0.69 |
| 2 | F16 | 1.45 | 1.45 | ◉ | ◉ | 0.70 | ◉ | ◉ | 0.33 | ○ | 0.85 |
| 3 | F17 | 1.70 | 1.68 | ◉ | ◉ | 0.80 | ◉ | ◉ | 0.32 | ○ | 0.90 |
| 4 | F18 | 1.68 | 1.66 | ◉ | ◉ | 0.97 | ◉ | ◉ | 0.35 | ○ | 0.97 |
| Comparative | | | | | | | | | | | |
| 5 | None | 1.72 | 1.72 | ◉ | ◉ | 0.85 | x | ◉ | 0.33 | △ | 0.99 |
| 6 | F19 | 1.54 | 1.52 | X | X | 0.86 | X | ◉ | 0.53 | ○ | 0.86 |
| 7 | F20 | 1.68 | 1.70 | ◉ | ◉ | 0.73 | ◉ | ◉ | 0.38 | ○ | 0.69 |
| 8 | F21 | 1.24 | 1.18 | X | X | 1.04 | X | X | 0.65 | △ | 1.04 |
| 9 | F22 | 0.77 | 0.72 | X | ○ | 0.80 | ○ | ◉ | 0.38 | △ | 0.80 |
| 10 | F23 | 1.71 | 1.69 | X | X | 1.09 | X | ◉ | 0.39 | X | 1.09 |
| 11 | F24 | 1.57 | 1.54 | ◉ | △ | 0.39 | X | X | 0.88 | ○ | 0.39 |
| 12 | F25 | 1.24 | 1.28 | ◉ | ◉ | 0.83 | ◉ | ◉ | 0.37 | ○ | 0.83 |

It can be understood from Table 3 that the laminates of Test Nos. 1 to 4 and 7 exhibit good properties equal to or better than those of the laminate using no filler, showing that the specific inorganic fillers enable laminates to retain the properties useful in electrical applications.

EXAMPLE 4

The laminates which had shown good properties in Example 3 were examined for drilling processability under the following conditions.
Number of laminates piled : Two 1.6 mm-thick laminates with 18 μm copper foil clad on both sides thereof.
Revolution for drill: 80,000 r.p.m.
Drilling speed: 30 μm/rev. (2.4 mm/min).
Drill bit: Union Tool UC 30, diameter=0.45.
Caul plate: Upper plate, 0.15 mm-thick aluminum plate; lower plate, 1.6 mm-thick Bake plate.
Number of hits: 6,000 hits.

TABLE 4

| Test No. | Test No. in Ex. 3 | Filler | Wear of drill blade (%) | Roughness of hole wall (μm) | | Hole diameter (mm) | Precision of hole position (Mean deviation) (μm) |
| --- | --- | --- | --- | --- | --- | --- | --- |
| | | | | Upper plate | Lower plate | | |
| Example | | | | | | | |
| 1 | 1 | F13 | 42 | 12 | 12 | 0.39 | 25 |
| 2 | 2 | F16 | 40 | 10 | 12 | 0.39 | 25 |
| 3 | 3 | F17 | 40 | 12 | 12 | 0.39 | 25 |
| 4 | 4 | F18 | 50 | 10 | 12 | 0.38 | 30 |
| Comparative | | | | | | | |
| 5 | 5 | None | 40 | 25 | 20 | 0.39 | 25 |
| 6 | 7 | F20 | 85 | 10 | 12 | 0.36 | 50 |

As is apparent from the forgoing description, Examples and Comparative Examples, the metal foil-clad laminate of the present invention, in which the resin-impregnated substrate containing a specific amount of an inorganic filler having a particle diameter in a specific range is used as the layer which adheres to the metal foil or as the surface layer, has good surface smoothness.

Furthermore, due to the inorganic filler which is selected from specific kinds, the metal foil-clad laminate also has excellent properties and processability. Because of these improvements, printed-circuit boards having excellent properties and finer patterns can be produced from the laminate and, therefore, the metal foil-clad laminate of the present invention is industrially of great significance.

While the invention has been described in detail and with reference to specific embodiments thereof, it will be apparent to one skilled in the art that various changes and modifications can be made therein without departing from the spirit and scope thereof.

What is claimed is:

1. A metal foil-clad laminate obtained by lamination molding a (i) resin-impregnated substrate comprising at least one of woven glass fabric or nonwoven glass fabric, and (ii) a metal foil, wherein said resin-impregnated substrate contains from 5 to 30% by weight of at least one inorganic filler selected from the group consisting of calcined kaolin, spherical fused silica, non-swellable synthetic mica, and a glass fine powder; the filler having an average particle diameter of from 0.1 to 5 μm and at least 90 wt % of the filler having a particle diameter of 0.02 to 5 μm; thereby providing a surface smooth metal foil-clad laminate having a diminished surface undulation attributable to the resin impregnated substrate.

2. A metal foil-clad laminate as claimed in claim 1, wherein substantially all of particles of said inorganic filler have a particle diameter of from 0.1 to 5 μm.

3. A metal foil-clad laminate as claimed in claim 1, wherein the content of the inorganic filler in the resin-impregnated substrate is from 10 to 25% by weight.

4. A metal foil-clad laminate as claimed in claim 1, wherein said inorganic filler is a filler which has been surface-treated with a coupling agent.

5. A metal foil-clad laminate as claimed in claim 1, wherein said resin-impregnated substrate is a surface layer of said laminate.

6. A metal foil-clad laminate as claimed in claim 1, wherein said resin-impregnated substrate is laminated between an upper sheet of said metal foil and a lower sheet of said metal foil.

7. A metal foil-clad laminate as claimed in claim 1, wherein said resin-impregnated substrate is woven glass fabric.

8. A metal foil-clad laminate as claimed in claim 1, wherein said resin-impregnated substrate is nonwoven glass fabric.

9. A metal foil-clad laminate as claimed in claim 1, wherein said resin-impregnated substrate comprises a nonwoven fabric intermediate layer, and a woven fabric surface layer adjacent said metal foil.

* * * * *